United States Patent
Ok

(10) Patent No.: US 8,775,761 B2
(45) Date of Patent: Jul. 8, 2014

(54) SEMICONDUCTOR MEMORY DEVICE AND SEMICONDUCTOR MEMORY SYSTEM INCLUDING THE SAME

(75) Inventor: Sung-Hwa Ok, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 879 days.

(21) Appl. No.: 12/965,092

(22) Filed: Dec. 10, 2010

(65) Prior Publication Data

US 2012/0137084 A1     May 31, 2012

(30) Foreign Application Priority Data

Nov. 30, 2010   (KR) ........................ 10-2010-0120752

(51) Int. Cl.
   *G06F 12/00*   (2006.01)
(52) U.S. Cl.
   USPC .......................................... 711/167; 711/154
(58) Field of Classification Search
   USPC ................................................. 711/167, 154
   See application file for complete search history.

(56) References Cited

FOREIGN PATENT DOCUMENTS

| JP | 2002-358796 | 12/2002 |
| KR | 1020070107976 | 11/2007 |
| KR | 1020090036414 | 4/2009 |
| KR | 100930401 | 12/2009 |

OTHER PUBLICATIONS

Notice of Allowance issued by the Korean Intellectual Property Office on Jun. 12, 2012.

*Primary Examiner* — Matthew Bradley
(74) *Attorney, Agent, or Firm* — IP & T Group LLP

(57) ABSTRACT

A semiconductor memory device includes: an internal clock signal generation unit configured to generate an internal clock signal in response to an external clock signal; an internal data strobe signal generation unit configured to generate an internal data strobe signal in response to an external data strobe signal; a phase comparison unit configured to compare phases of the internal clock signal and the internal data strobe signal that are used in an enabled write path in response to an internal dummy write command with each other; and an output unit configured to output an output signal of the phase comparison unit.

25 Claims, 6 Drawing Sheets

SEMICONDUCTOR MEMORY DEVICE AND SEMICONDUCTOR MEMORY SYSTEM INCLUDING THE SAME

CROSS-REFERENCE TO RELATED APPLICATIONS

The present application claims priority of Korean Patent Application No. 10-2010-0120752, filed on Nov. 30, 2010, which is incorporated herein by reference in its entirety.

BACKGROUND OF THE INVENTION

Exemplary embodiments of the present invention relate to a semiconductor designing technology, and more particularly, to a semiconductor memory device and a semiconductor memory system including the semiconductor memory device.

A Double Data Rate 4 (DDR4) semiconductor memory device is configured to include a domain crossing margin (tDQSS) between a data strobe signal and a clock signal. Accordingly, the DDR4 semiconductor memory device may use a write leveling technology for calibrating a skew between the data strobe signal and the clock signal during a write operation.

A write leveling operation may be performed by entering a write leveling mode in response to a mode register set (MRS) and outputting a signal indicating the logic level state of a clock signal at a rising edge of a data strobe signal. More specifically, when a semiconductor memory device enters a write leveling mode, the semiconductor memory device compares the phase of an inputted data strobe signal with the phase of a clock signal and feeds the comparison result back to an external controller. Then, the external controller controls the phase of the data strobe signal based on the comparison result which is fed back from the semiconductor memory device.

The conventional write leveling operation has the following features. The semiconductor memory device compares the phase of the data strobe signal with the phase of a clock signal on a pad by pad basis. In other words, the phases of a pad-based data strobe signal and a pad-based clock signal are compared with each other. For this reason, the domain crossing margin (tDQSS) between the data strobe signal and the clock signal is secured only on the pad by pad basis. Therefore, the conventional write leveling operation may not reflect the actual write operation environment and may not stably secure the domain crossing margin (tDQSS) between the data strobe signal and the clock signal within a circuit where the write operation actually occurs. Here, securing the domain crossing margin (tDQSS) between a data strobe signal and a clock signal becomes more difficult in a high-frequency environment.

The conventional semiconductor memory device compares the phase of the data strobe signal with the phase of the clock signal at every toggling duration of the data strobe signal. More specifically, the conventional semiconductor memory device samples the phase state of the clock signal at every rising edge occurring in a toggling duration of the data strobe signal. However, if the phases are compared in the above-described method, time and current are consumed wastefully and the efficiency of the write leveling operation is decreased.

SUMMARY OF THE INVENTION

An embodiment of the present invention is directed to a semiconductor memory device for stably securing a domain crossing margin (tDQSS) between a data strobe signal and a clock signal in an actual write operation environment, and a semiconductor memory system including the semiconductor memory device.

Another embodiment of the present invention is directed to minimizing the amounts of time and current consumed during a write leveling operation and increasing the efficiency of the write leveling operation.

In accordance with an embodiment of the present invention, a semiconductor memory device includes: an internal clock signal generation unit configured to generate an internal clock signal in response to an external clock signal; an internal data strobe signal generation unit configured to generate an internal data strobe signal in response to an external data strobe signal; a phase comparison unit configured to compare phases of the internal clock signal and the internal data strobe signal that are used in an enabled write path in response to an internal dummy write command with each other; and an output unit configured to output an output signal of the phase comparison unit.

In accordance with another embodiment of the present invention, a semiconductor memory device includes: an internal clock signal generation unit configured to generate an internal clock signal in response to an external clock signal; an internal data strobe signal generation unit configured to generate an internal data strobe signal in response to an external data strobe signal; a phase comparison pulse generation unit configured to generate a phase comparison pulse which is enabled over a predetermined duration of the internal clock signal in response to a dummy write command; a transfer unit configured to selectively transfer the internal clock signal and the internal data strobe signal in response to a write leveling signal and the phase comparison pulse; a phase comparison unit configured to compare a phase of the internal clock signal with a phase of the internal data strobe signal that are outputted from the transfer unit with each other; and an output unit configured to output an output signal of the phase comparison unit.

In accordance with yet another embodiment of the present invention, a semiconductor memory system includes: a memory controller configured to provide a dummy write command, a clock signal, and a data strobe signal and control a phase of the data strobe signal in response to a phase state signal; and a semiconductor memory device configured to respectively generate internalized signals of the clock signal and the data strobe signal in response to the dummy write command and compare a phase of the internalized clock signal and a phase of the internalized data strobe signal during a predetermined duration of the internalized clock signal in response to the dummy write command and output the phase state signal.

DESCRIPTION OF SPECIFIC EMBODIMENTS

Figure 1:
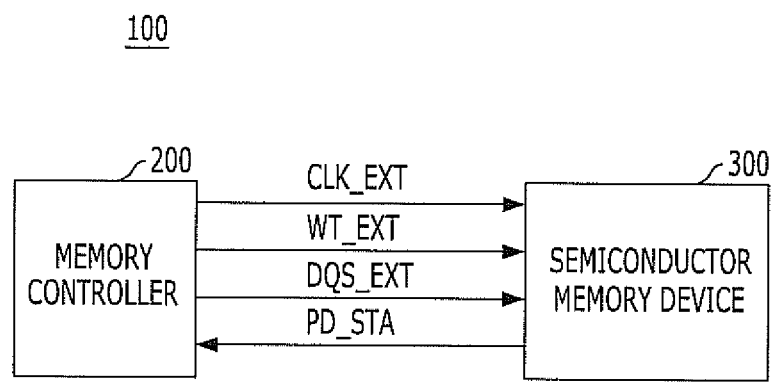
FIG. 1 is a block view illustrating a semiconductor memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block view illustrating a semiconductor memory system in accordance with an exemplary embodiment of the present invention. According an example, a semiconductor memory device receives a single pulse-type external data strobe signal during a coarse write leveling operation instead of receiving multiple pulses to coarsely adjust a phase of an internal data strobe signal in comparison to a phase of an internal clock signal and thus reduce current consumption by not comparing the phases more frequently. Subsequently, in the fine write leveling operation, the semiconductor memory device receives multiple pulses of the external data strobe signal to finely adjust a phase of the internal data strobe signal in comparison to a phrase of the internal clock signal, where the phase comparison occurs more frequently due to use of the multiple pulses.

Referring to FIG. 1, a semiconductor memory system 100 includes a memory controller 200 and a semiconductor memory device 300. The memory controller 200 provides the semiconductor memory device 300 with an external dummy write command WT_EXT, an external clock signal CLK_EXT, and an external data strobe signal DQS_EXT, and controls the phase of the external data strobe signal DQS_EXT in response to a phase state signal PD_STA fed back from the semiconductor memory device 300. The semiconductor memory device 300 generates internalized signals of the external clock signal CLK_EXT and the external data strobe signal DQS_EXT, compares, during coarse write leveling operation the phase of the internalized data strobe signal with the phase of the internalized clock signal in a predetermined duration of the internalized clock signal in response to the external dummy write command WT_EXT to thereby produce a comparison result, and outputs the comparison result as the phase state signal PD_STA.

Here, the memory controller 200 performs a coarse write leveling operation and a fine write leveling operation to save time when it performs a write leveling operation. First, in the coarse write leveling operation, the memory controller 200 primarily trains the phase of the external data strobe signal DQS_EXT by repeatedly performing a process of providing the semiconductor memory device 300 with the external data strobe signal DQS_EXT in the form of a single pulse and controlling the phase of the external data strobe signal DQS_EXT coarsely (that is, by a low resolution) in response to the phase state signal PD_STA which is fed back from the semiconductor memory device 300.

Here, since the semiconductor memory device 300 receives the single pulse-type external data strobe signal DQS_EXT, unnecessary current consumption is prevented compared with a case of receiving a repeatedly toggling signal. Subsequently, in the fine write leveling operation, the memory controller 200 secondarily trains the phase of the external data strobe signal DQS_EXT by repeatedly performing a process of providing the semiconductor memory device 300 with the external data strobe signal DQS_EXT in the form of multiple pulses and controlling the phase of the external data strobe signal DQS_EXT finely (that is, by a high resolution) in response to the phase state signal PD_STA which is fed back from the semiconductor memory device 300. Here, the multiple pulses are the same as the external data strobe signal DQS_EXT applied from the memory controller 200 during an actual write operation. Since the semiconductor memory device 300 performs a phase comparison operation in the same environment as the actual write operation environment when the multiple pulse-type external data strobe signal DQS_EXT is applied, the semiconductor memory device 300 may provide the memory controller 200 with the phase state signal PD_STA reflecting inter-symbol interference (ISI) that occurs due to channel characteristics.

Figure 2:
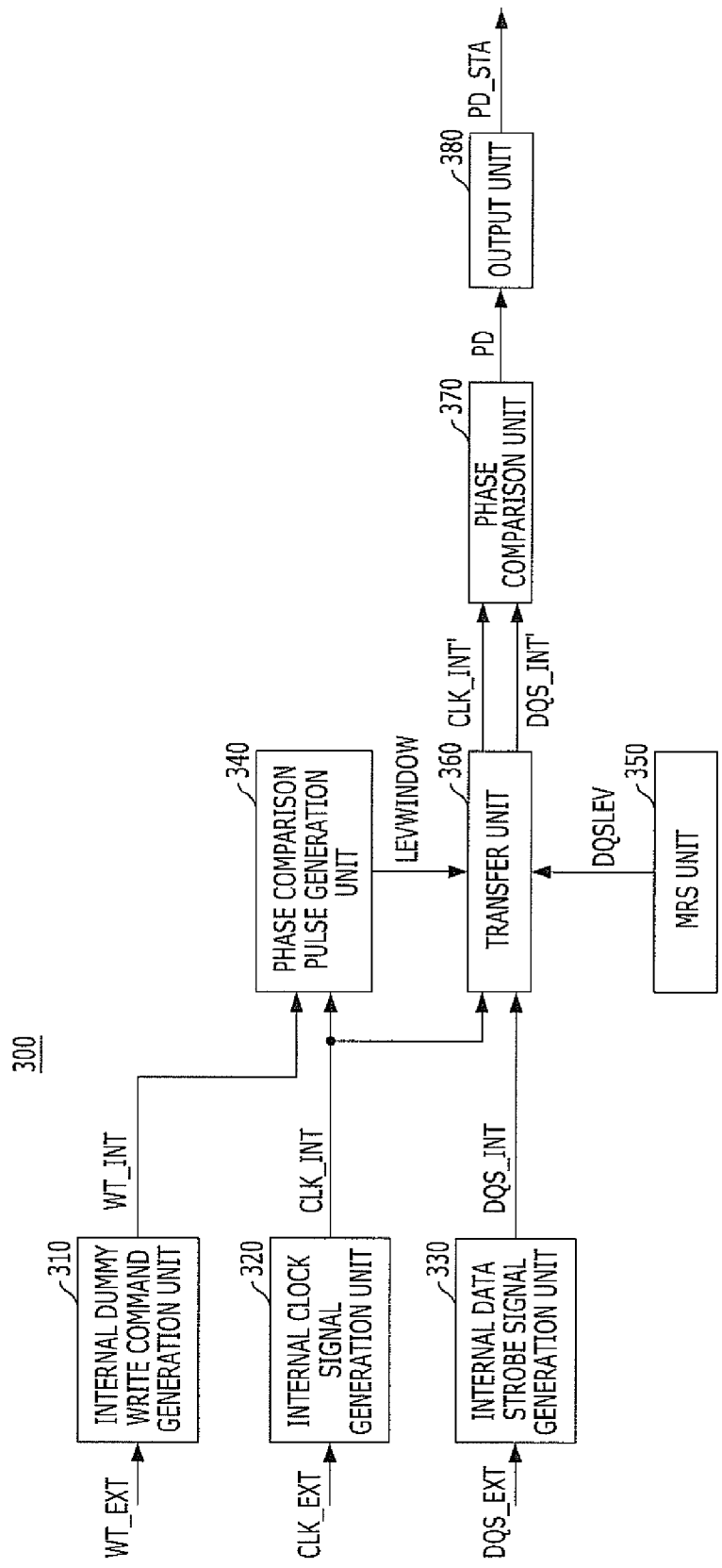
FIG. 2 is a block view illustrating a semiconductor memory device shown in FIG. 1.
Figure 3:
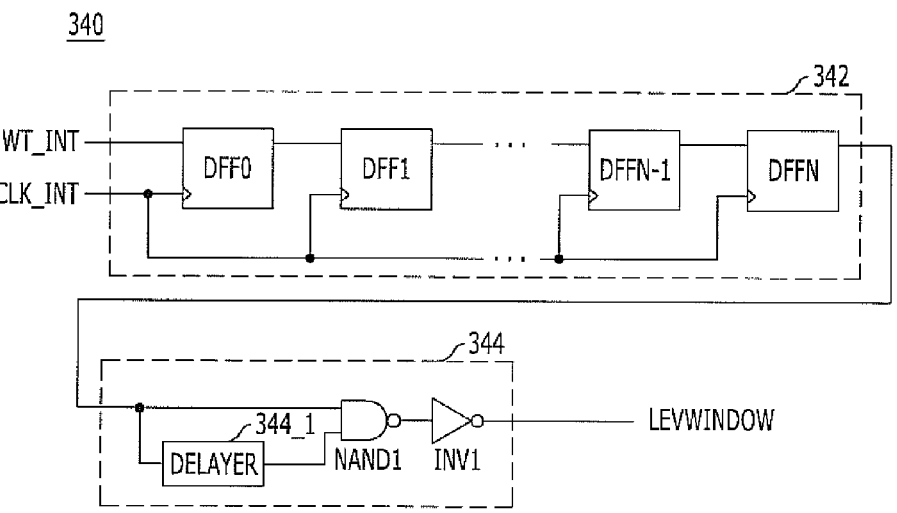
FIG. 3 is a block view of a phase comparison pulse generation unit shown in FIG. 2.
Figure 4:
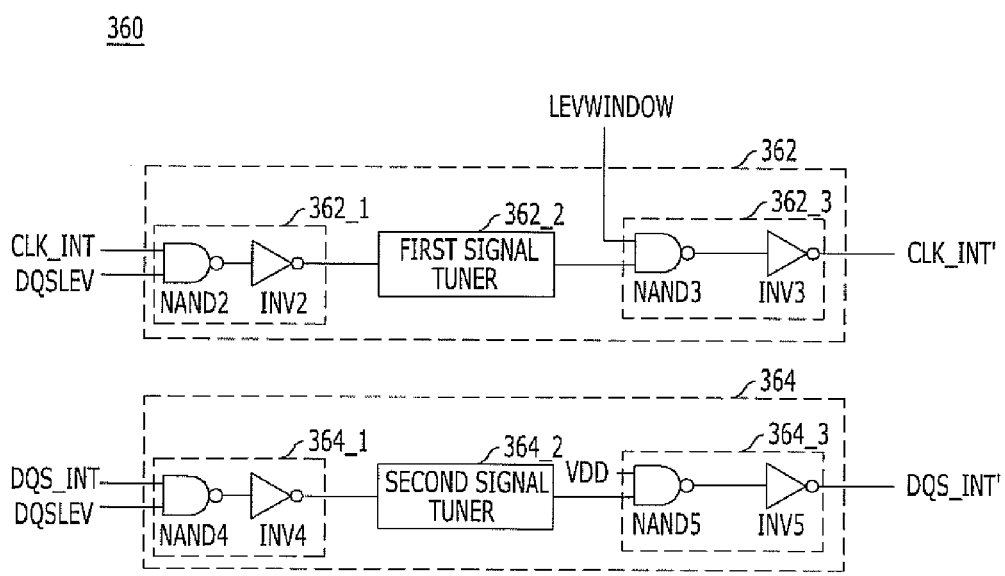
FIG. 4 is a block view of a transfer unit shown in FIG. 2.

FIG. 2 is an exemplary block view illustrating the semiconductor memory device 300 shown in FIG. 1, and FIG. 3 is an exemplary block view of a phase comparison pulse generation unit 340 shown in FIG. 2. FIG. 4 is an exemplary block view of a transfer unit 360 shown in FIG. 2.

Referring to FIG. 2, the semiconductor memory device 300 according to an exemplary embodiment includes an internal dummy write command generation unit 310, an internal clock signal generation unit 320, an internal data strobe signal generation unit 330, a phase comparison pulse generation unit 340, a Mode Register Set (MRS) unit 350, a transfer unit 360, a phase comparison unit 370, and an output unit 380. The internal dummy write command generation unit 310 generates an internal dummy write command WT_INT which corresponds to the external dummy write command WT_EXT. The internal clock signal generation unit 320 generates an internal clock signal CLK_INT which corresponds to the external clock signal CLK_EXT. The internal data strobe signal generation unit 330 generates an internal data strobe signal DQS_INT which corresponds to the external data strobe signal DQS_EXT. Initially, during a coarse write leveling operation, the phase comparison pulse generation unit 340 generates a phase comparison pulse LEVWINDOW which is enabled in a predetermined duration of the internal clock signal CLK_INT in response to the internal dummy write command WT_INT. The MRS unit 350 provides a write leveling signal DQSLEV. The transfer unit 360 selectively transfers the internal clock signal CLK_INT and the internal data strobe signal DQS_INT in response to the write leveling signal DQSLEV and the phase comparison pulse LEVWINDOW. The phase comparison unit 370 compares the phase of an internal clock signal CLK_INT' that is outputted from the transfer unit 360 and the phase of the internal data strobe signal DQS_INT' that is outputted from the transfer unit 360. The output unit 380 outputs an output signal PD of the phase comparison unit 370 as a phase state signal PD_STA.

Referring to FIG. 3, the phase comparison pulse generation unit 340 includes a delay circuit 342 and a pulse width controller 344. The delay circuit 342 synchronizes the internal dummy write command WT_INT with the internal clock signal CLK_INT and delays it by a predetermined duration. The pulse width controller 344 controls the pulse width of the internal dummy write command WT_INT that is delayed by the delay circuit 342. The delay circuit 342 may be realized as a D flip-flop chain where a plurality of D flip-flops DFF0 to DFFN are serially coupled with each other. The pulse width controller 344 may be realized in the form of a pulse generator which includes a delayer 344_1, a NAND gate NAND1, and an inverter INV1. The pulse width of the delayed internal dummy write command WT_INT is controlled to be smaller than one clock cycle (1 tCK) of the internal clock signal CLK_INT and outputted as the phase comparison pulse LEVWINDOW. This is because the internal clock signal CLK_INT' that is outputted from the transfer unit 360 is to be outputted in the form of a single pulse. More specifically, when the pulse width of the phase comparison pulse LEVWINDOW is greater than the 1 period (1 tCK) of the internal clock signal CLK_INT, a glitch may occur in the internal clock signal CLK_INT' that is outputted from the transfer unit 360.

Meanwhile, when the skew between the internal clock signal CLK_INT and the internal data strobe signal DQS_INT is '0', the phase comparison pulse LEVWINDOW is positioned to overlap a rising edge of the internal clock signal CLK_INT that corresponds to a particular rising edge of the internal data strobe signal DQS_INT. This is to compare the phase of the internal data strobe signal DQS_INT with the phase of the internal clock signal CLK_INT at a particular desired timing which, for example, determines the operation of the semiconductor memory device 300. Therefore, the adequate efficiency of a write leveling operation may be obtained.

Referring to FIG. 4, the transfer unit 360 according to an example includes a first signal transfer circuit 362 and a second signal transfer circuit 364. The first signal transfer circuit 362 transfers the internal clock signal CLK_INT to the phase comparison unit 370 in response to the write leveling signal DQSLEV and the phase comparison pulse LEVWINDOW. The second signal transfer circuit 364 transfers the internal data strobe signal DQS_INT to the phase comparison unit 370 in response to the write leveling signal DQSLEV and a predetermined power source voltage VDD. The first signal transfer circuit 362 includes a first signal input unit 362_1, a first signal tuner 362_2, and a first signal output unit 362_3. The first signal input unit 362_1 receives the internal clock signal CLK_INT in response to the write leveling signal DQSLEV. The first signal tuner 362_2 tunes the internal clock signal CLK_INT inputted through the first signal input unit 362_1. The first signal output unit 362_3 outputs the tuned internal clock signal obtained in the first signal tuner 362_2 during an enabled duration of the phase comparison pulse LEVWINDOW.

The first signal input unit 362_1 includes a NAND gate NAND2 for performing a NAND operation on the internal clock signal CLK_INT and the write leveling signal DQSLEV and an inverter INV2 for inverting and outputting the output signal of the NAND gate NAND2. The first signal output unit 362_3 includes a NAND gate NAND3 for performing a NAND operation on the internal clock signal obtained from the first signal tuner 362_2 and the phase comparison pulse LEVWINDOW and an inverter INV3 for inverting and outputting the output signal of the NAND gate NAND3.

The second signal transfer circuit 364 includes a second signal input unit 364_1, a second signal tuner 364_2, and a second signal output unit 364_3. The second signal input unit 364_1 receives the internal data strobe signal DQS_INT in response to the write leveling signal DQSLEV. The second signal tuner 364_2 tunes the internal data strobe signal inputted through the second signal input unit 364_1. The second signal output unit 364_3 bypasses the tuned internal data strobe signal obtained in the second signal tuner 364_2. The second signal input unit 364_1 includes a NAND gate NAND4 for performing a NAND operation on the internal data strobe signal DQS_INT and the write leveling signal DQSLEV and an inverter INV4 for inverting and outputting the output signal of the NAND gate NAND4. The second signal output unit 364_3 includes a NAND gate NAND5 for performing a NAND operation on the tuned internal data strobe signal obtained from the second signal tuner 364_2 and the power source voltage VDD and an inverter INV5 for inverting and outputting the output signal of the NAND gate NAND5. Here, the first and second signal tuners 362_2 and 364_2 are optional components and may be omitted.

Figure 5:
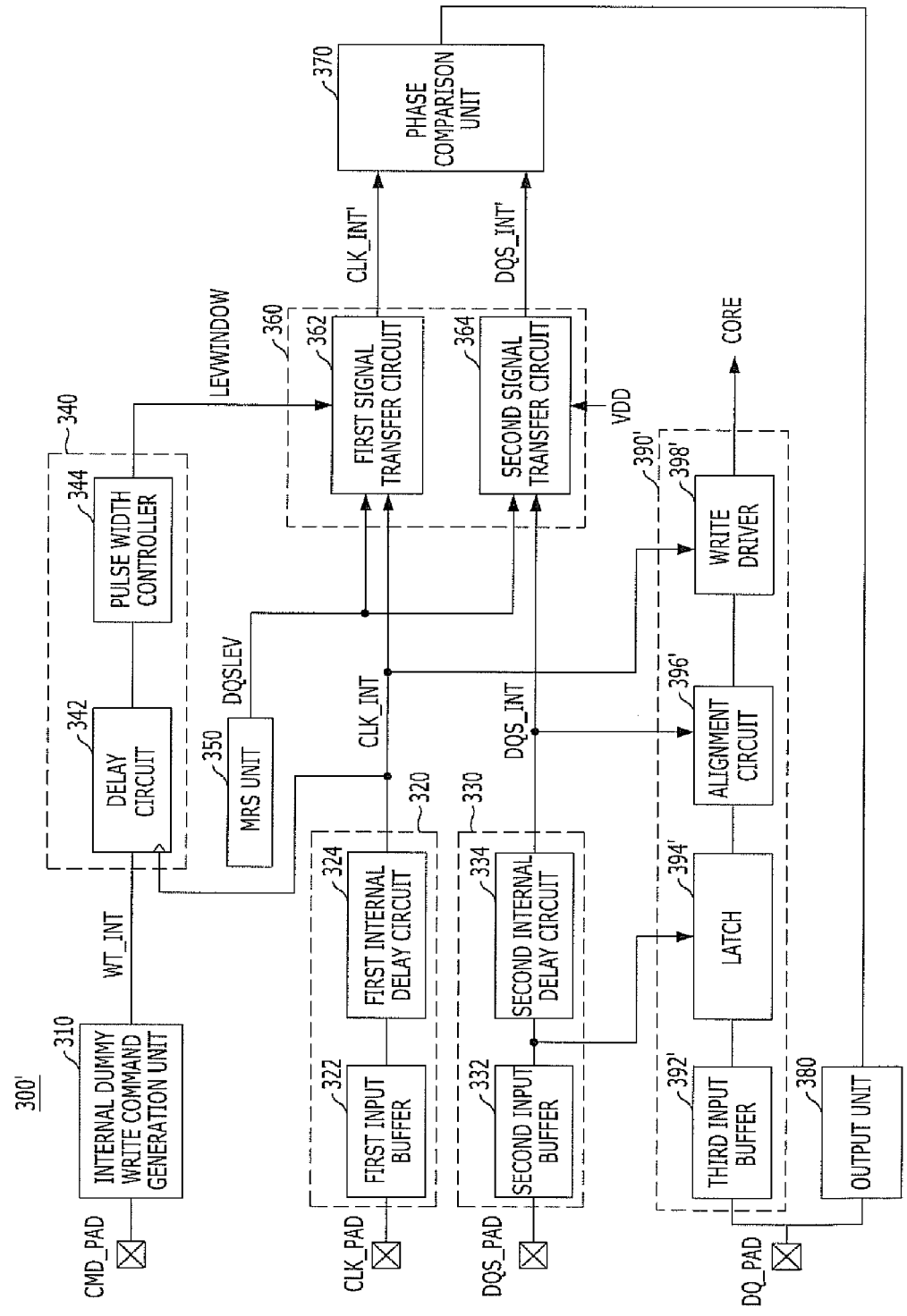
FIG. 5 is a block view illustrating a circuit structure of the semiconductor memory device of FIG. 1 including an actual write path.

FIG. 5 is a block view illustrating a circuit structure of the semiconductor memory device 300 of FIG. 1 showing an actual write path. The same reference numbers are given to the same components in FIG. 2.

The internal dummy write command generation unit 310, the internal clock signal generation unit 320, and the internal data strobe signal generation unit 330 are described in detail hereafter. Further, the write path 390' shown in FIG. 5 is described. The phase comparison pulse generation unit 340 and the transfer unit 360 which have been described in detail before and thus, any redundant description thereof is omitted herein.

Referring to FIG. 5, the internal dummy write command generation unit 310 generates the internal dummy write command WT_INT by decoding the external dummy write command WT_EXT inputted through a command pad CMD_PAD. Here, the external dummy write command WT_EXT received through the command pad CMD_PAD is a multi-bit signal and may include a chip selection signal /SC, a column address strobe signal /CAS, a row address strobe signal /RAS, and a write enable signal /WE.

The internal clock signal generation unit 320 includes a first input buffer 322 for buffering the external clock signal CLK_EXT inputted through the clock pad CLK_PAD and a first internal delay circuit 324 for delaying the buffered clock signal outputted from the first input buffer 322 and outputting the delayed clock signal as the internal clock signal CLK_INT. The first internal delay circuit 324 may include any reasonably suitable repeater which repeats an attenuated signal for maintaining the original signal strength despite a signal line load and may add an internal delay in the course of generating the internal clock signal CLK_INT.

The internal data strobe signal generation unit 330 includes a second input buffer 332 for buffering the external data strobe signal DQS_EXT inputted through a data strobe pad DQS_PAD and a second internal delay circuit 334 for delaying the buffered data strobe signal outputted from the second input buffer 332 and outputting the delayed data strobe signal as the internal data strobe signal DQS_INT. The second internal delay circuit 334 may include any reasonably suitable repeater which repeats an attenuated signal for maintaining the original signal strength despite a signal line load and may add an internal delay in the course of generating the internal data strobe signal DQS_INT.

Meanwhile, the write path 390' includes a third input buffer 392' for buffering a data (not shown) inputted through a data pad DQ_PAD, a latch 394' for latching the buffered data outputted from the third input buffer 392' in response to the buffered data strobe signal, an alignment circuit 396' for aligning the latched data obtained from the latch 394' in response to the internal data strobe signal DQS_INT and a write driver 398' for providing a core region CORE with the aligned data outputted from the alignment circuit 396' in response to the internal clock signal CLK_INT.

While further details of the write path 390' having the above-described structure are not illustrated in the drawings, the operation of the write path 390' is such that write path 390' is enabled according to a signal derived based on the internal dummy write command WT_INT. Since the internal clock signal CLK_INT and the internal data strobe signal DQS_INT are actual signals used for the actual write path 390' of a core region, same signal interference in training the internal clock signal CLK_INT and the internal data strobe signal DQS_INT apply to the actual write operation. Thus, training of the internal clock signal CLK_INT and the internal data strobe signal DQS_INT minimizes any skew between the two signals.

Meanwhile, the phase comparison unit 370 compares the phases of the internal data strobe signal DQS_INT and the internal clock signal CLK_INT that are used in the write path 390'. In other words, the phase comparison unit 370 compares the phase of the internal data strobe signal DQS_INT applied to the alignment circuit 396' with the phase of the internal clock signal CLK_INT applied to the write driver 398'. The alignment circuit 396' and the write driver 398' are subject to a phase difference between the internal data strobe signal DQS_INT and the internal clock signal CLK_INT in term of a domain crossing from an internal data strobe signal DQS_INT domain to an internal clock signal CLK_INT domain, where the phase comparison unit 370 detects the phase difference and the memory controller 200 minimizes the phase difference. As a result, the domain crossing margin (tDQSS) between the internal data strobe signal DQS_INT and the internal clock signal CLK_INT may be appropriately obtained.

Hereafter, the operation of the semiconductor memory system 100 having the above-described structure is described with reference to FIGS. 6 and 7.

Figure 6:
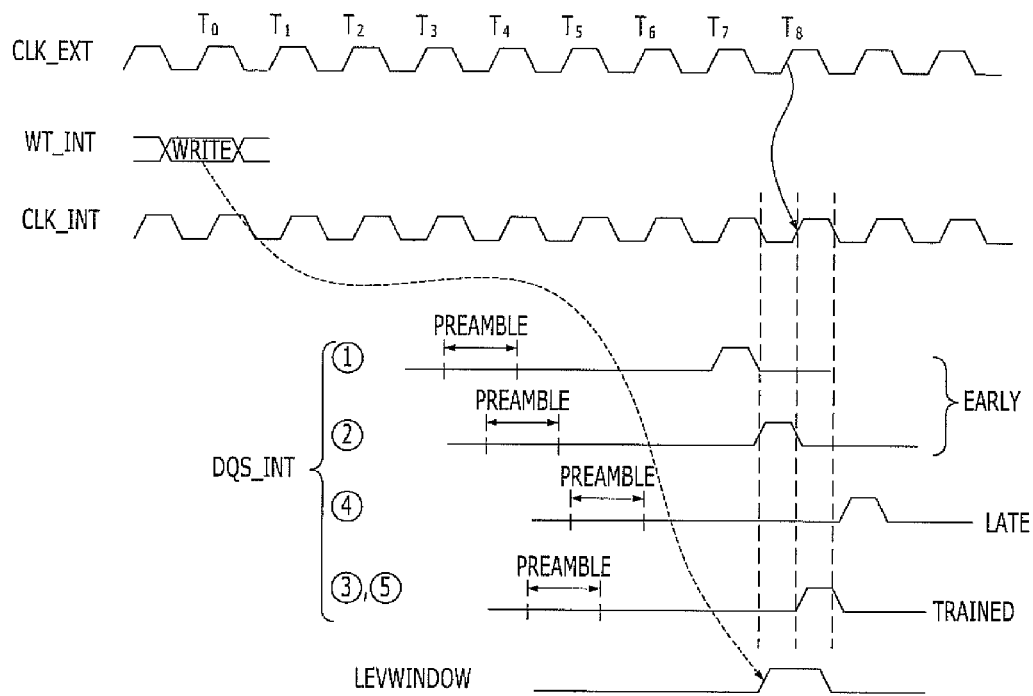
FIG. 6 is a timing diagram describing a coarse write leveling operation in an operation of a semiconductor memory system in accordance with an embodiment of the present invention.
Figure 7:
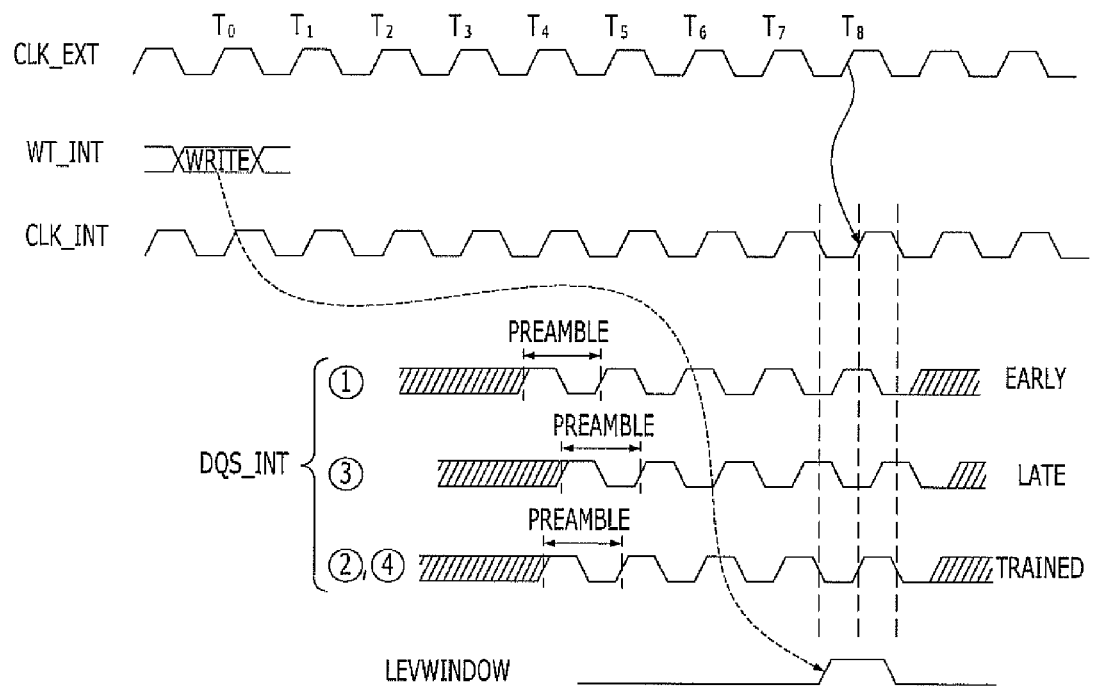
FIG. 7 is a timing diagram describing a fine write leveling operation in an operation of a semiconductor memory system in accordance with an embodiment of the present invention.

FIG. 6 is a timing diagram describing a coarse write leveling operation for the semiconductor memory system 100 in accordance with an embodiment of the present invention, and FIG. 7 is a timing diagram describing a fine write leveling operation for the semiconductor memory system 100 in accordance with an embodiment of the present invention.

In this embodiment, an 8-bit burst operation is taken as an example, and accordingly, a data strobe signal DQS_# has a preamble duration of 1 tCK, which corresponds to one period of a clock signal CLK_#, and has a data output duration of 4 tCK, which corresponds to four periods of the clock signal CLK_#.

First, the coarse write leveling operation is described hereafter.

Referring to FIG. 6, the memory controller 200 continuously applies an external clock signal CLK_EXT to the semiconductor memory device 300, and the internal dummy write command generation unit 310 of the semiconductor memory device 300 generates an internal clock signal CLK_INT corresponding to the external clock signal CLK_EXT. The internal clock signal CLK_INT is used in the write path 390'. More specifically, the internal clock signal CLK_INT is used for enabling the write driver 398' of the write path 390'.

When the memory controller 200 provides the semiconductor memory device 300 with an external dummy write command WT_EXT at a predetermined timing, the internal dummy write command generation unit 310 generates an internal dummy write command WT_INT which corresponds to the received external dummy write command WT_EXT.

The phase comparison pulse generation unit 340 generates a phase comparison pulse LEVWINDOW by delaying the internal dummy write command WT_INT by a predetermined duration in response to the internal clock signal CLK_INT. More specifically, when the skew between the internal clock signal CLK_INT and the internal data strobe signal DQS_INT is '0', the phase comparison pulse generation unit 340 delays the internal dummy write command WT_INT and outputs the delayed write command as the phase comparison pulse LEVWINDOW that has a pulse extending over a certain rising edge of the internal clock signal CLK_INT corresponding to a rising edge of 'T8' of the external clock signal CLK_EXT, which in turn corresponds to the last rising edge (if there were plural rising edges as in the case of a fine write leveling operation) of the internal data strobe signal DQS_INT.

Also, the phase comparison pulse generation unit 340 according to an example controls the pulse width of the phase comparison pulse LEVWINDOW to be smaller than one clock cycle of the internal clock signal CLK_INT. This is to prevent a glitch occurring in transferring the internal clock signal CLK_INT' during an enabled duration of the phase comparison pulse LEVWINDOW. At the same time, the write path 390' is enabled in response to a signal derived based on the internal dummy write command WT_INT. Here, the internal clock signal CLK_INT and the internal data strobe signal DQS_INT that are trained are the same signals used for the write path 390' so that the compensation of the same signals during the training is similarly application when the same signal are actually used for the write path 390 to provide data to a core region, where the training occurs in the same environment as the actual write operation including any signal interference.

Meanwhile, after a predetermined time passes from the time that the memory controller 200 provides the external dummy write command WT_EXT, the memory controller 200 generates an external data strobe signal DQS_EXT in the form of a single pulse during a coarse write leveling operation and provides the semiconductor memory device 300 with the generated external data strobe signal DQS_EXT. In short, the memory controller 200 provides the external dummy write command WT_EXT in the same way it does in the actual write operation and then generates a single pulse corresponding to the last rising edge and the last falling edge of the 8-bit burst data based on the preamble duration of the external data strobe signal DQS_EXT generated after a predetermined latency and provides the semiconductor memory device 300 with them as the external data strobe signal DQS_EXT.

Subsequently, the internal data strobe signal generation unit 330 of the semiconductor memory device 300 generates an internal data strobe signal DQS_INT which corresponds to the external data strobe signal DQS_EXT. The internal data strobe signal DQS_INT is used in the write path 390'. More specifically, internal data strobe signal DQS_INT is an internal data strobe signal applied to the alignment circuit 396' of the write path 390'.

Subsequently, the transfer unit 360 transfers the internal clock signal CLK_INT to the phase comparison unit 370 during an enabled period of the phase comparison pulse LEVWINDOW and simultaneously transfers the internal data strobe signal DQS_INT to the phase comparison unit 370.

The phase comparison unit 370 compares the phase of the internal clock signal CLK_INT' with the phase of the internal data strobe signal DQS_INT', and outputs a phase comparison signal PD which corresponds to the comparison result. In the phase comparison operation, the phase state of the internal data strobe signal DQS_INT' is determined in relation to the phase of the internal clock signal CLK_INT'. For example, when the phase of the internal data strobe signal DQS_INT' is earlier than the phase of the internal clock signal CLK_INT', the phase comparison unit 370 outputs a phase comparison signal PD of a logic low level. When the phase of the internal data strobe signal DQS_INT' is later than the phase of the internal clock signal CLK_INT', the phase comparison unit 370 outputs a phase comparison signal PD of a logic high level.

When the phase comparison signal PD is outputted, the output unit 380 provides the memory controller 200 with a phase state signal PD_STA corresponding to the phase comparison signal PD through the data pad DQ_PAD.

Upon receipt of the phase state signal PD_STA, the memory controller 200 controls the phase of the external data strobe signal DQS_EXT to be adjusted by low resolution.

Subsequently, the memory controller 200 and the semiconductor memory device 300 perform the series of the operations described above in a predetermined times. The memory controller 200 trains the phase of the external data strobe signal DQS_EXT based on the write leveling operation that is performed in the predetermined times. More specifically, reference symbols ①, ②, ③ and ④ marked in FIG. 6 shows a process where the phase is uniformly controlled by low resolution adjustment units, and a reference symbol ⑤ shows a process of selecting the optimally controlled phase among the references symbols ①, ②, ③ and ④. More specifically, the memory controller 200 controls the phase of the external data strobe signal DQS_EXT in the sequence of ①, ②, ③ and ④ and provides the semiconductor memory device 300 with the controlled phase. The semiconductor memory device 300 provides the memory controller 200 with a phase state signal PD_STA which corresponds to signals represented by the references symbols ①, ②, ③ and ④. For example, the semiconductor memory device 300 provides the memory controller 200 with a phase state signal PD_STA of a logic low level in response to the phase of the internal data strobe signal DQS_INT being earlier than the phase of the internal clock signal CLK_INT in cases represented by references symbols ① and ②, and provides the memory controller 200 with a phase state signal PD_STA of a logic high level in response to the phase of the internal data strobe signal DQS_INT being later than the phase of the internal clock signal CLK_INT in a case represented by reference symbols ③ and ④. As a result, the memory controller 200 determines the internal data strobe signal ③ having a phase of a moment when the logic level state of the phase state signal PD_STA transitions from a logic low level to a logic high level as a primarily trained data strobe signal ⑤.

Hereafter, a fine write leveling operation is described.

Since the fine write leveling operation is similar to the coarse write leveling operation in general, the reference symbols ①, ②, ③ and ④ marked in FIG. 7 are described herein. Here, since the internal data strobe signal DQS_INT in the fine write leveling operation has the same toggling structure as a data strobe signal provided during an actual write operation, the actual write operation environment including any inter-symbol interference may be reflected.

Referring to FIG. 7, the memory controller 200 controls the phase of the external data strobe signal DQS_EXT by adjustment units smaller than one period (1 tCK) of the internal clock signal CLK_INT based on the phase of the primarily trained data strobe signal ① obtained through the coarse write leveling operation. Here, the memory controller 200 controls the phase of the external data strobe signal DQS_EXT to appear in a higher resolution than that of the coarse write leveling operation. More specifically, the memory controller 200 controls the phase in the sequence of ①, ② and ③ and provides the semiconductor memory device 300 with the controlled phase. The semiconductor memory device 300 provides the memory controller 200 with a phase state signal PD_STA corresponding to the references symbols ①, ② and ③. For example, the semiconductor memory device 300 provides the memory controller 200 with a phase state signal PD_STA of a logic low level in response to the phase of the internal data strobe signal DQS_INT being earlier than the phase of the internal clock signal CLK_INT for the internal data strobe signal 10, and provides the memory controller 200 with a phase state signal PD_STA of a logic high level in response to the phase of the internal data strobe signal DQS_INT being later than the phase of the internal clock signal CLK_INT for the internal data strobe signal ② and ③. As a result, the memory controller 200 determines the internal data strobe signal ② having a phase of a moment when the logic level state of the phase state signal PD_STA transitions from a logic low level to a logic high level as a secondarily trained data strobe signal ④. Here, the secondarily trained data strobe signal ④ becomes the finally trained data strobe signal, and the memory controller 200 fixes the phase of the finally trained data strobe signal.

Subsequently, the memory controller 200 provides the semiconductor memory device 300 with the external data strobe signal DQS_EXT based on the fixed phase of the fully trained data strobe signal during the actual write operation.

According to an exemplary embodiment of the present invention, the domain crossing margin (tDQSS) between an internal data strobe signal and an internal clock signal may be secured by reflecting the phase difference between the internal data strobe signal and the internal clock signal at an operation point where an actual domain crossing occurs in a write operation environment. For example, since the phases of the internal data strobe signal DQS_INT and the internal clock signal CLK_INT are compared with each other at a timing that, for example, determines operations, the adequate efficiency of the write leveling operation may be obtained. The efficiency of the write leveling operation may be obtained even in a high-frequency environment.

According to an exemplary embodiment of the present invention, the domain crossing margin (tDQSS) between an internal data strobe signal and an internal clock signal may be secured by detecting the phase difference between the internal data strobe signal and the internal clock signal at an operation point where an actual domain crossing occurs in a write operation environment. In particular, the domain crossing margin (tDQSS) between the internal data strobe signal and the internal clock signal can be appropriately secured even in a high-frequency environment.

According to an exemplary embodiment of the present invention, the time taken for a write leveling operation may be minimized by performing a coarse write leveling operation first and then a fine write leveling operation during the write leveling operation. Current consumption may be minimized as the write leveling operation uses a single pulse-type data strobe signal at the coarse write leveling operation.

In addition, the technology of the present invention may increase the efficiency of the write leveling operation by comparing the phase of an internal data strobe signal with the phase of an internal clock signal at a timing point that is important in determining the operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   an internal clock signal generation unit configured to generate an internal clock signal in response to an external clock signal;
   an internal data strobe signal generation unit configured to generate an internal data strobe signal in response to an external data strobe signal;
   a phase comparison unit configured to compare phases of the internal clock signal and the internal data strobe signal that are used in an enabled write path in response to an internal dummy write command with each other; and
   an output unit configured to output an output signal of the phase comparison unit.

2. The semiconductor memory device of claim 1, wherein the write path comprises:
   an input buffer configured to buffer a data inputted through a data pad to produce a buffered data;
   an alignment circuit configured to align the buffered data outputted from the input buffer in response to the internal data strobe signal to produce an aligned data; and
   a write driver configured to provide an internal circuit with the aligned data outputted from the alignment circuit in response to the internal clock signal.

3. The semiconductor memory device of claim 1, wherein the write path is configured to be enabled based on a signal derived based on the internal dummy write command.

4. The semiconductor memory device of claim 1, further comprising:
   a command decoding unit configured to generate the internal dummy write command by decoding a plurality of external commands.

5. The semiconductor memory device of claim 1, further comprising a phase comparison pulse generation unit configured to generate a phase comparison pulse having a pulse width smaller than a clock cycle of the internal clock cycle, wherein the phase comparison unit is configured to receive the phase comparison pulse.

6. The semiconductor memory device of claim 1, further comprising a transfer unit to transfer the internal clock signal to the phase comparison unit in response to the phase comparison pulse and to bypass the internal data strobe signal to the phase comparison unit in response to a power source voltage.

7. A semiconductor memory device, comprising:
   an internal clock signal generation unit configured to generate an internal clock signal in response to an external clock signal;
   an internal data strobe signal generation unit configured to generate an internal data strobe signal in response to an external data strobe signal;
   a phase comparison pulse generation unit configured to generate a phase comparison pulse which is enabled over a first duration of the internal clock signal in response to a dummy write command;
   a transfer unit configured to selectively transfer the internal clock signal and the internal data strobe signal in response to a write leveling signal and the phase comparison pulse;
   a phase comparison unit configured to compare a phase of the internal clock signal with a phase of the internal data strobe signal that are outputted from the transfer unit with each other; and
   an output unit configured to output an output signal of the phase comparison unit.

8. The semiconductor memory device of claim 7, wherein the predetermined duration of the internal clock signal includes a toggling duration of a trained data strobe signal, which is the internal data strobe signal whose phase becomes the same as the phase of the internal clock signal.

9. The semiconductor memory device of claim 8, wherein the toggling duration is a duration excluding a preamble duration of the trained data strobe signal.

10. The semiconductor memory device of claim 7, wherein the phase comparison pulse generation unit comprises:
    a delay circuit configured to delay the dummy write command to produce a delayed dummy write command in response to the internal clock signal; and
    a pulse width controller configured to control a pulse width of the delayed dummy write command obtained in the delay circuit.

11. The semiconductor memory device of claim 10, wherein the delay circuit comprises a D flip-flop chain.

12. The semiconductor memory device of claim 10, wherein the pulse width controller is configured to control the pulse width of the delayed dummy write command to be smaller than one period of the internal clock signal.

13. The semiconductor memory device of claim 7, wherein the transfer unit comprises:
    a first signal transfer circuit configured to transfer the internal clock signal to the phase comparison unit in response to the write leveling signal and the phase comparison pulse; and
    a second signal transfer circuit configured to transfer the internal data strobe signal to the phase comparison unit in response to the write leveling signal and a predetermined power source voltage.

14. The semiconductor memory device of claim 13, wherein the first signal transfer circuit comprises:
    a first signal input unit configured to receive the internal clock signal in response to the write leveling signal; and
    a first signal output unit configured to output the internal clock signal outputted from the first signal input unit during an enabled duration of the phase comparison pulse.

15. The semiconductor memory device of claim 14, wherein the first signal transfer circuit further comprises a first signal tuner coupled between the first signal input unit and the first signal output unit.

16. The semiconductor memory device of claim 13, wherein the second signal transfer circuit comprises:
    a second signal input unit configured to receive the internal data strobe signal in response to the write leveling signal; and
    a second signal output unit configured to bypass the internal data strobe signal outputted from the second signal input unit in response to the predetermined power source voltage.

17. The semiconductor memory device of claim 16, wherein the second signal transfer circuit further comprises a second signal tuner coupled between the second signal input unit and the second signal output unit.

18. A semiconductor memory system, comprising:
    a memory controller configured to provide a dummy write command, a clock signal, and a data strobe signal and control a phase of the data strobe signal in response to a phase state signal; and
    a semiconductor memory device configured to respectively generate internalized signals of the clock signal and the data strobe signal in response to the dummy write command and compare a phase of the internalized clock signal with a phase of the internalized data strobe signal during a predetermined duration of the internalized clock signal in response to the dummy write command and output the phase state signal.

19. The semiconductor memory system of claim 18, wherein the memory controller is configured to provide the semiconductor memory device with the data strobe signal in a form of a single pulse during a coarse write leveling operation and provide the semiconductor memory device with the data strobe signal in a form of multiple pulses during a fine write leveling operation.

20. The semiconductor memory system of claim 19, wherein the memory controller is configured to adjust the data strobe signal to appear in a low resolution in the coarse write leveling operation.

21. The semiconductor memory system of claim 19, wherein the memory controller controls the data strobe signal to appear in a high resolution in the fine write leveling operation.

22. The semiconductor memory system of claim 19, wherein the memory controller is configured to determine a secondarily trained data strobe signal in the fine write leveling operation based on a primarily trained data strobe signal determined in the coarse write leveling operation.

23. The semiconductor memory system of claim 22, wherein the memory controller is configured to perform the fine write leveling operation within a duration corresponding to one clock cycle of the internalized clock signal based on the primarily trained data strobe signal.

24. The semiconductor memory system of claim 19, wherein the predetermined duration of the clock signal is a toggling duration of a trained data strobe signal, which is the internalized data strobe signal whose phase becomes the same as the phase of the internalized clock signal.

25. The semiconductor memory system of claim 24, wherein the toggling duration is a duration excluding a preamble duration of the trained data strobe signal.

\* \* \* \* \*